(12) United States Patent
Huang et al.

(10) Patent No.: US 8,049,862 B2
(45) Date of Patent: Nov. 1, 2011

(54) INDIUM TIN OXIDE (ITO) LAYER FORMING

(75) Inventors: Lili Huang, San Jose, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 475 days.

(21) Appl. No.: 12/189,133

(22) Filed: Aug. 8, 2008

(65) Prior Publication Data

US 2010/0035030 A1    Feb. 11, 2010

(51) Int. Cl.
| | |
|---|---|
| *G02F 1/13* | (2006.01) |
| *B32B 3/00* | (2006.01) |
| *B32B 9/00* | (2006.01) |
| *B05D 7/00* | (2006.01) |
| *B05C 11/00* | (2006.01) |
| *C23C 16/44* | (2006.01) |

(52) U.S. Cl. ........ 349/187; 428/201; 428/697; 428/426; 428/210; 427/419.2; 427/255.23; 118/696

(58) Field of Classification Search .................. 349/187; 313/506; 438/30; 118/696; 427/419.2, 255.23; 428/201, 697, 426, 210

See application file for complete search history.

(56) References Cited

U.S. PATENT DOCUMENTS

| | | | |
|---|---|---|---|
| 5,395,663 A * | 3/1995 | Tabata et al. .................. | 427/554 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,316,343 B1 * | 11/2001 | Wada et al. .................. | 438/584 |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 2002/0016075 A1 | 2/2002 | Peng et al. | |

(Continued)

FOREIGN PATENT DOCUMENTS

JP    01-009893 A    1/1989

(Continued)

OTHER PUBLICATIONS

International Search Report mailed Jan. 29, 2010, for PCT Application No. PCT/US2009/051876, filed Jul. 27, 2009, three pages.

(Continued)

*Primary Examiner* — Brian Healy
(74) *Attorney, Agent, or Firm* — Morrison & Foerster LLP

(57) ABSTRACT

A layer of material, such as crystalline indium tin oxide (ITO), is formed on top of a substrate by heating the material to a high temperature, while a temperature increase of the substrate is limited such that the temperature of the substrate does not exceed a predetermined temperature. For example, a layer including amorphous ITO can be deposited on top of the substrate, and the amorphous layer can be heated in a surface anneal process using radiation while limiting substrate temperature. Another process can pass electrical current through the amorphous ITO. In another process, the substrate is passed through a high-temperature deposition chamber quickly, such that a portion of a layer of crystalline ITO is deposited, while the temperature increase of the substrate is limited.

24 Claims, 13 Drawing Sheets

U.S. PATENT DOCUMENTS

| | | |
|---|---|---|
| 2003/0134122 A1 | 7/2003 | Wickboldt et al. |
| 2006/0003188 A1* | 1/2006 | Ohno et al. .................. 428/701 |
| 2006/0026521 A1 | 2/2006 | Hotelling et al. |
| 2006/0097991 A1 | 5/2006 | Hotelling et al. |
| 2006/0197753 A1 | 9/2006 | Hotelling |
| 2010/0035030 A1* | 2/2010 | Huang et al. .................. 428/201 |

FOREIGN PATENT DOCUMENTS

| | | |
|---|---|---|
| JP | 2000/163031 A | 6/2000 |
| JP | 2002/342033 A | 11/2002 |
| JP | 2008-170840 A | 7/2008 |
| WO | WO-2007/146785 A2 | 12/2007 |
| WO | WO-2007/146785 A3 | 12/2007 |
| WO | WO-2010/017054 A2 | 2/2010 |
| WO | WO-2010/017054 A3 | 2/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rogozin, A. et al. (2006). "Annealing of Indium Tin Oxide Films by Electric Current: Properties and Structure Evolution," *Applied Physics Letters*, three pages.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

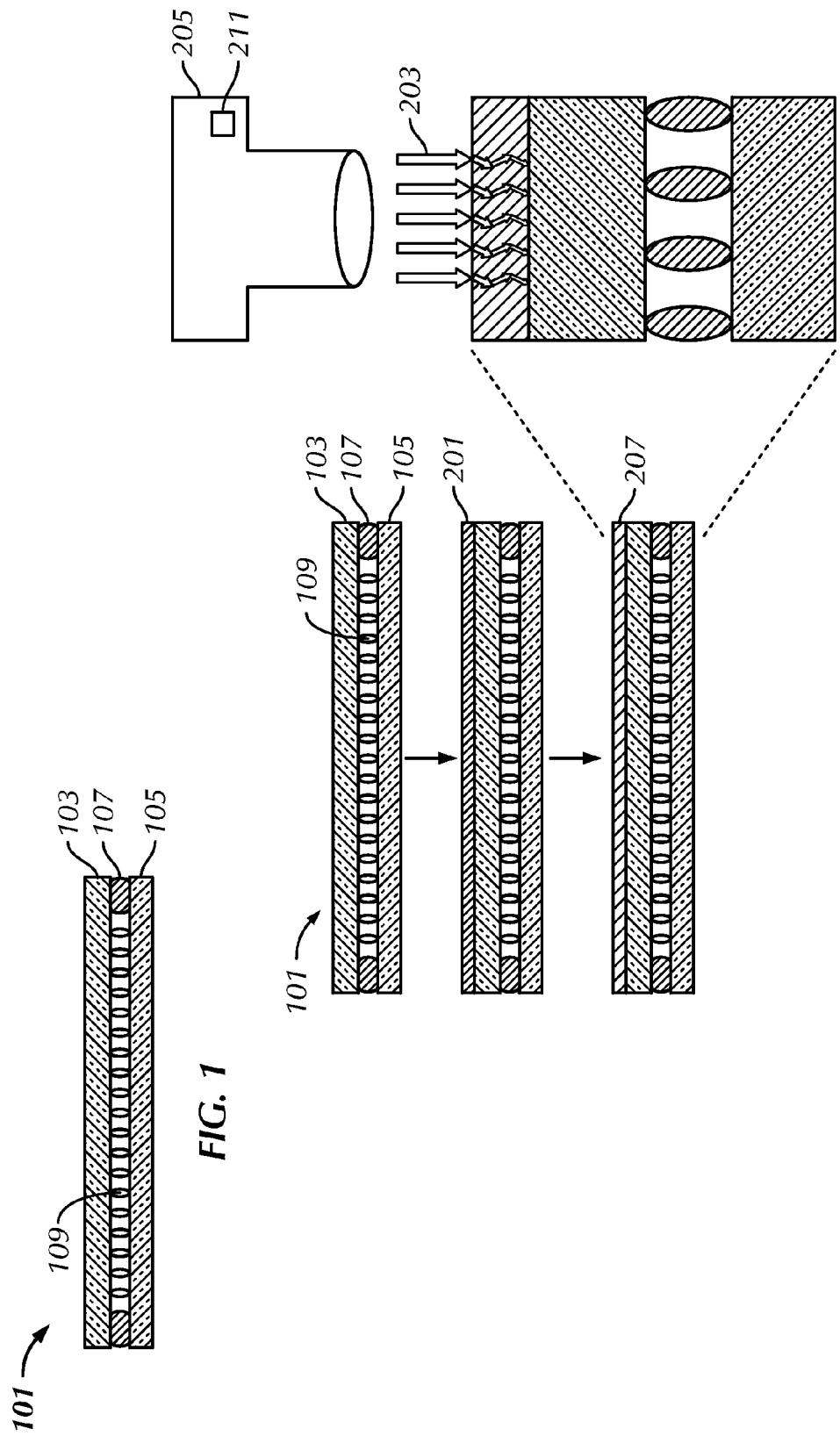

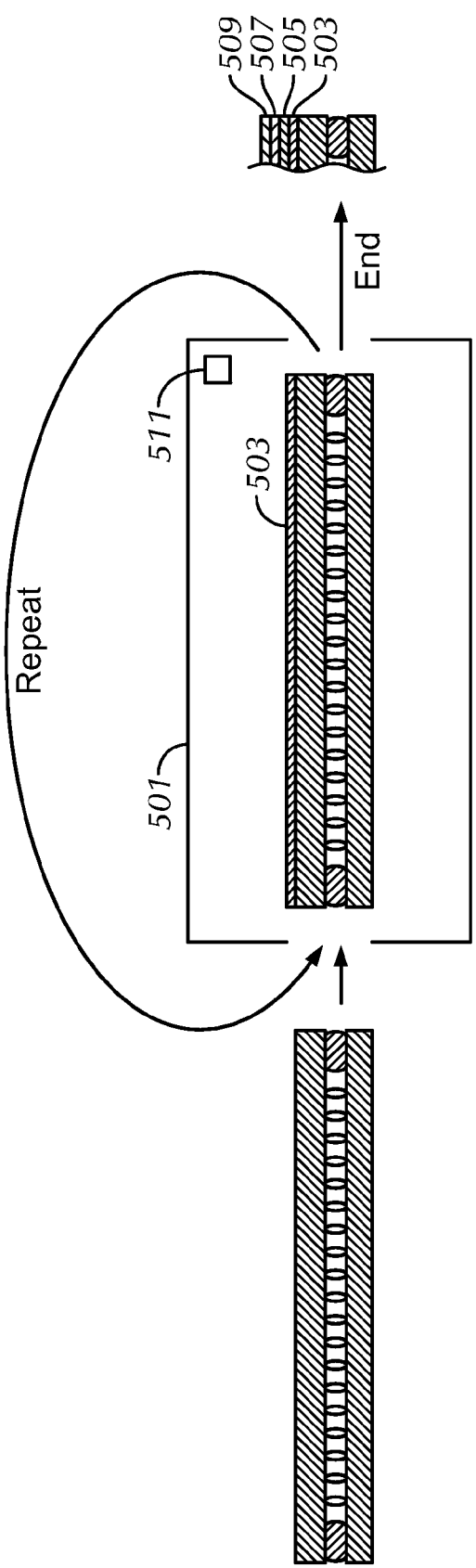
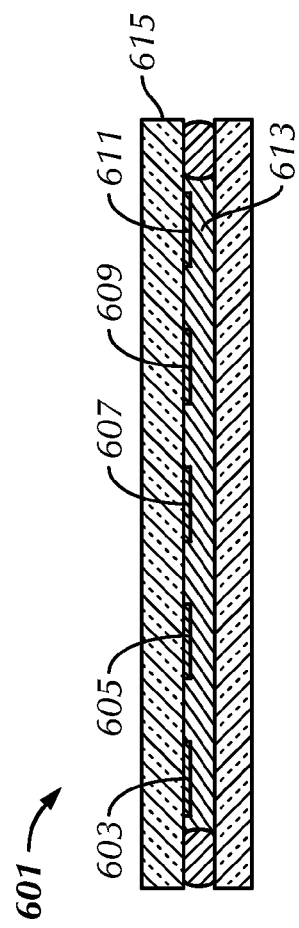
FIG. 5
FIG. 6

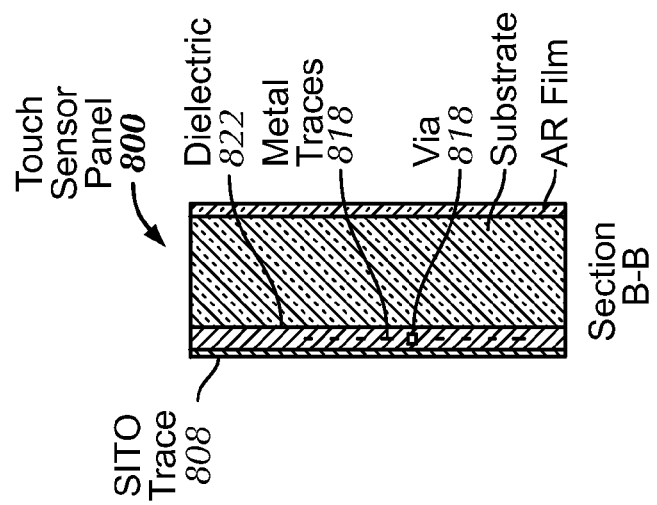
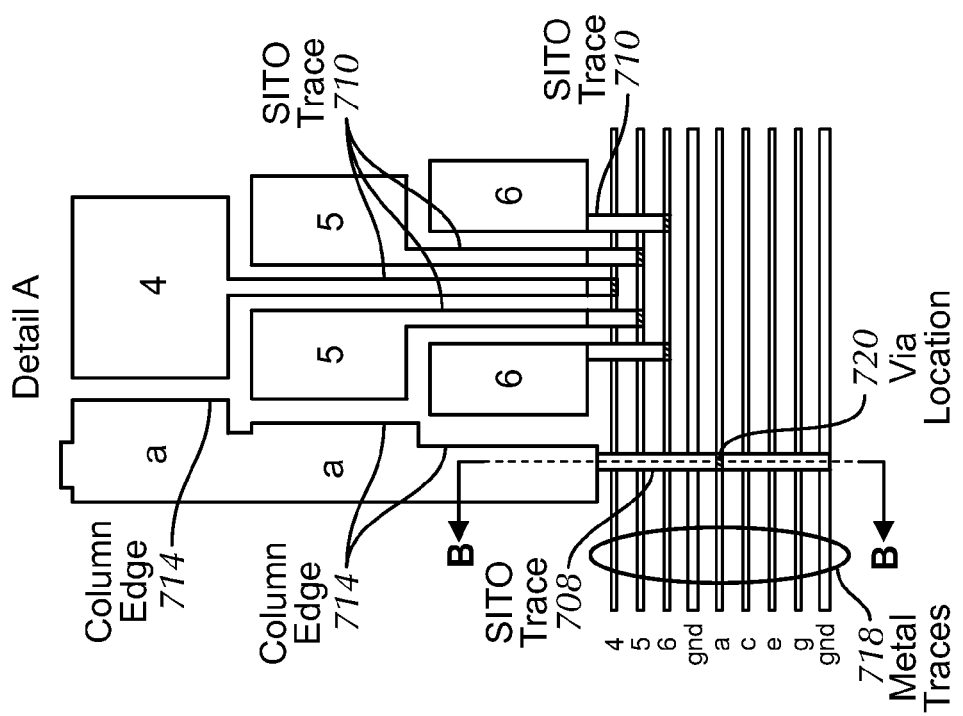

INDIUM TIN OXIDE (ITO) LAYER FORMING

FIELD OF THE INVENTION

This relates generally to the formation of indium tin oxide (ITO) layers, and in particular, forming a crystalline ITO layer on top of a substrate by heating ITO to high temperature while limiting a temperature increase of the substrate.

BACKGROUND OF THE INVENTION

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as ITO, often deposited in rows and columns in horizontal and vertical directions on a substantially transparent substrate. Conventional processes for depositing high-quality, crystalline ITO can require a substrate to be exposed to sustained temperatures as high as 350 degrees C. However, such high-temperature processes may not be suitable for some applications.

SUMMARY OF THE INVENTION

This relates to forming a crystalline ITO layer on top of a substrate by heating ITO to a high temperature while limiting a temperature increase of the substrate to less than a predetermined temperature. For example, a layer including amorphous ITO may be deposited on top of the substrate, and a surface anneal process may be used to cause the ITO to undergo a phase conversion from amorphous ITO to crystalline ITO. In the surface anneal process, energy is applied in such a way that most of the energy is absorbed by the layer including amorphous ITO, and not the substrate. For example, the amorphous ITO layer may be exposed to laser light, ultraviolet (UV) radiation, microwave radiation, or other electromagnetic (EM) radiation. The wavelength of the radiation can be chosen such that the amorphous ITO layer absorbs most of the energy of the radiation. In this way, for example, the amorphous ITO layer may be sufficiently heated to undergo the phase conversion to crystalline ITO while the temperature increase of the substrate can be limited to less than a predetermined temperature, since most of the energy is absorbed by the ITO layer. In another example, energy absorption can be focused on the ITO layer by applying an electrical current to the ITO layer. The electrical resistance of the ITO layer causes some of the energy of the electrical current to be absorbed by the ITO layer in the form of heat. Focusing the flow of the electrical current through the ITO layer can allow most of the energy to be absorbed by the amorphous ITO layer, thus heating the ITO to high temperature and causing phase conversion to crystalline ITO, while limiting the temperature increase of the substrate.

In another example, crystalline ITO may be deposited on a bare substrate (i.e., without a layer including amorphous ITO) using a deposition process, such as physical vapor deposition (PVD), that heats ITO to high temperature (e.g., 200-350 degrees C. or higher) while limiting the temperature increase of the substrate to less than a predetermined temperature. For example, the substrate may be passed through a high-temperature ITO deposition chamber quickly, before the temperature of the substrate increases beyond a predetermined threshold temperature, to deposit a thin layer of crystalline ITO. The substrate can be passed through the chamber multiple times until the ITO layer reaches a desired thickness. Between each pass, the substrate may be allowed to cool sufficiently in order to maintain the temperature of the substrate below the predetermined threshold temperature during the next pass.

BRIEF DESCRIPTION OF THE DRAWINGS

FIG. 1 illustrates an example LCD module on which a crystalline ITO layer or layers may be formed according to embodiments of the invention.

FIG. 2 illustrates an example method of forming a crystalline ITO layer on top of a substrate, such as a CF glass, while limiting a temperature increase of the substrate with a surface anneal process according to embodiments of the invention.

FIG. 5 illustrates another example method of forming a crystalline ITO layer according to embodiments of the invention using a fast deposition process.

FIG. 6 shows an example method of calibrating/testing a process of forming a crystalline ITO layer according to embodiments of the invention.

FIGS. 7a-c illustrate an example SITO configuration that may be formed according to embodiments of the invention.

FIGS. 8a-b show more details of the example SITO configuration of FIGS. 7a-c.

DETAILED DESCRIPTION OF THE PREFERRED EMBODIMENTS

Figure 3:
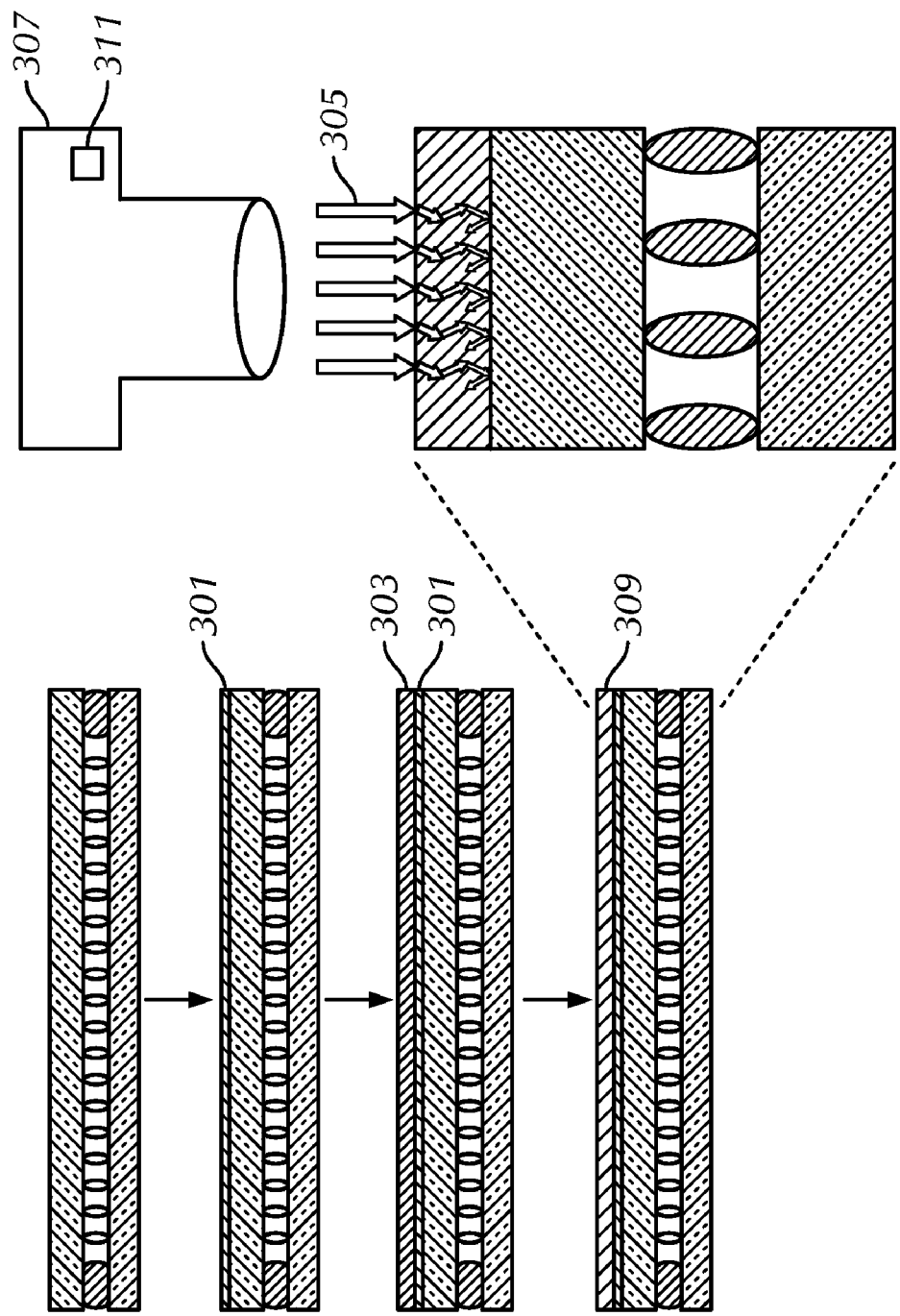
FIG. 3 illustrates another example method of forming a crystalline ITO layer according to embodiments of the invention.

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

This relates to forming a crystalline ITO layer on top of a substrate by heating ITO to a high temperature while limiting a temperature increase of the substrate to less than a predetermined temperature. For example, a layer including amorphous ITO may be deposited on top of the substrate, and a surface anneal process may be used to cause the ITO to undergo a phase conversion from amorphous ITO to crystalline ITO. The layer including amorphous ITO may be, for example, a layer including both amorphous ITO and crystalline ITO. In the surface anneal process, energy is applied in such a way that most of the energy is absorbed by the layer including amorphous ITO, and not the substrate. For example, the amorphous ITO layer may be exposed to laser light, ultraviolet (UV) radiation, microwave radiation, or other electromagnetic (EM) radiation. The wavelength of the radiation can be chosen such that the amorphous ITO layer absorbs most of the energy of the radiation. In this way, for example, the amorphous ITO layer may be sufficiently heated to undergo the phase conversion to crystalline ITO while the temperature increase of the substrate can be limited, since most of the energy is absorbed by the ITO layer. In another example, energy absorption can be focused on the ITO layer by applying an electrical current to the ITO layer. The electrical resistance of the ITO layer causes some of the energy of the electrical current to be absorbed by the ITO layer in the form of heat. Focusing the flow of the electrical current through the ITO layer can allow most of the energy to be absorbed by the amorphous ITO layer, thus heating the ITO to high temperature and causing phase conversion to crystalline ITO, while limiting the temperature increase of the substrate to less than a predetermined temperature.

In another example, crystalline ITO may be deposited on a bare substrate (i.e., without a layer including amorphous ITO) using a deposition process, such as physical vapor deposition (PVD), that heats ITO to high temperature (e.g., 200-350 degrees C. or higher) while limiting the temperature increase of the substrate to less than a predetermined temperature. For example, the substrate may be passed through a high-temperature ITO deposition chamber quickly, before the temperature of the substrate increases beyond a predetermined threshold temperature, to deposit a thin layer of crystalline ITO. The substrate can be passed through the chamber multiple times until the ITO layer reaches a desired thickness. Between each pass, the substrate may be allowed to cool sufficiently in order to maintain the temperature of the substrate below the predetermined threshold temperature during the next pass.

Forming a crystalline ITO layer on top of a substrate while limiting a temperature increase of the substrate may be particularly useful in the production of LCD touch screens, for example, since the liquid crystal of the LCD can degrade if exposed to temperatures beyond approximately 100 degrees C. In this regard, the following example embodiments of the invention are described and illustrated herein in terms of LCD touch screens. However, it should be understood that embodiments of this invention are not so limited, but are additionally applicable to other applications in which a crystalline layer of ITO is formed on top of a temperature sensitive substrate and/or near a temperature sensitive material. It should also be noted that embodiments of this invention are also applicable to the formation of crystalline ITO on substrates in general, that is, even when there is no particular temperature sensitivity of the substrate or surrounding materials. Furthermore, embodiments of this invention are not limited to ITO, but may be applicable to other materials in which the formation of a layer requires heating of the material to a high-temperature. In addition, it is noted that the term "crystalline ITO" as used herein should not be interpreted as only pure, 100 percent crystalline ITO, but is meant to include materials having a substantial proportion of crystalline ITO.

FIG. 1 shows an example LCD module 101 on which crystalline ITO may be formed according to embodiments of the invention. LCD module 101 includes a color filter (CF) glass 103 having RGB (red, green, blue) pixels and a black mask (BM) patterned on the front side (not shown), and a thin-film transistor (TFT) glass 105 having thin film transistors patterned on the front side (not shown). CF glass 103 and TFT glass 105 generally have a thickness of approximately 0.5 mm. LCD module 101 also includes spacers 107 and liquid crystal (LC) 109, which is filled between the front side of CF glass 103 and the front side of TFT glass 105. LC 109 may be filled using a one drop fill (ODF) process, for example. After the LC is filled, the back side of CF glass 103 and the back side of TFT glass 105 can be thinned to a thickness of approximately 0.2 mm, for example, using a polishing process.

In processing LCD module 101 for use as a touch screen, ITO may be deposited on top of the back side of CF glass 103 to form drive and sense lines, for example. The ITO can be patterned in one or more layers, for example, as part of a single-layer ITO (SITO) configuration, a dual-layer ITO (DITO) configuration, a configuration that includes DITO and an ITO shield layer, and other configurations. ITO would be formed after the thinning process, otherwise the ITO would be removed by the thinning process. Forming an ITO layer or layers on the back side of CF glass 103 after LCD module 101 has been filled with LC 109 and CF glass 103 and TFT glass 105 have been thinned can reduce the z-height of a touch screen panel stackup, and can potentially result in thinner, lighter touch screen devices. However, while typical crystalline ITO deposition processes can require temperatures around 350 degrees C., LC 109 may degrade at temperatures above approximately 100 degrees C.

FIG. 2 shows an example method of forming a crystalline ITO layer on top of a substrate, such as CF glass 103, by heating ITO to high temperature while limiting a temperature increase of the substrate with a surface anneal process according to embodiments of the invention. An amorphous ITO layer 201 of approximately 100-1000 Angstroms is deposited onto CF glass 103 at a low temperature, such as room temperature. For example, a low-temperature sputterer (not shown) may be used to deposit amorphous ITO layer 201. Amorphous ITO layer 201 has a high sheet resistance (e.g., 400-700 Ohms per square) and has a poor transmittance of light due primarily to the amorphous structure of the ITO.

A surface anneal is performed on amorphous ITO layer 201. The surface anneal heats layer 201 to an annealing temperature, causing the amorphous ITO to undergo a phase conversion to crystalline ITO. The process limits a temperature increase of LCD module 101, and consequently, the temperature of LC 109 may be kept below a predetermined threshold value, for example, 100 degrees C. The surface anneal may be done by exposing layer 201 to electromagnetic (EM) radiation 203, for example, ultraviolet (UV) radiation, laser light, microwave radiation, etc., from an EM radiation source 205. The wavelength of radiation can be chosen such that absorption of radiation 203 by amorphous ITO layer 201 is high. In this case, ITO layer 201 can absorb a high proportion of radiation 203, and the radiation not absorbed by the ITO layer (i.e., the radiation passing through the ITO layer, sometimes referred to herein as "remaining radiation") that reaches LCD module 101 can be kept low. UV radiation having a wavelength of less than 300 nm, for example, may be used. The high absorption of radiation 203 heats amorphous ITO layer 201 to a temperature sufficient to cause the phase conversion to a crystalline ITO layer 207. In comparison to amorphous ITO layer 201, crystalline ITO layer 207 has a lower sheet resistance, approximately 100-200 Ohms per square, due to the substantial proportion of crystalline ITO in layer 207 formed as a result of the process. In addition, crystalline ITO layer 207 has a better transmittance due a substantial proportion of layer 207 (i.e., the crystalline ITO portion of the layer) having a crystalline structure.

Radiation 203 may be applied in a variety of ways. For example, radiation 203 may be applied in a variety of time duration profiles. In some embodiments, for example, radiation 203 may be applied for a single period of time to complete the anneal process. In other embodiments, radiation 203 may be applied on and off multiple times over the course of the anneal process, allowing heat transferred to LCD module 101 to dissipate during off periods, which may further limit the temperature increase of the LCD module. Radiation 203 may be applied at a variety of intensities. Radiation 203 may be applied at different incident angles, e.g., a 90 degree angle (i.e., normal to the surface), a 45 degree angle, a grazing angle, which is close to zero degrees (i.e., nearly parallel to the surface), etc., with respect to ITO layer 201. Radiation source 205 includes a controller 211 that controls these various factors, such as the time duration profile, wavelength, incident angle, etc.

FIG. 3 shows another example method of forming a crystalline ITO layer according to embodiments of the invention, in which an intermediate layer 301 is formed on a substrate, such as the back side of CF glass 103, prior to forming an amorphous ITO layer 303. Intermediate layer 301 can be a formed of a material that reflects and/or absorbs an EM radiation 305 from an EM radiation source 307 used in the surface anneal process to form crystalline ITO layer 309. Radiation source 307 includes a controller 311 that controls various factors, such as the time duration profile, wavelength, incident angle, etc. In addition, intermediate layer 301 can be more or less transparent at optical wavelengths, which may be particularly advantageous for applications using visible light, such as touch screens.

After forming intermediate layer 301 and amorphous ITO layer 303, radiation 305 can be applied in a variety of ways, similar to the methods described above. However, in comparison to the foregoing methods, the addition of intermediate layer 301 may further limit the temperature increase of LCD module 101 by reflecting and/or absorbing radiation not initially absorbed by ITO layer 303, i.e., remaining radiation. In the case that intermediate layer 301 reflects radiation 305, the intermediate layer can reduce or eliminate the amount of radiation that reaches LCD module 101, which would potentially be absorbed by LC 109, by reflecting remaining radiation away from the LCD module and back into ITO layer 303. Because reflection typically occurs at or near the surface of the reflective material, a reflective intermediate layer may be a very thin layer.

In the case that intermediate layer 301 absorbs radiation 305, the intermediate layer could reduce or eliminate the amount of radiation that reaches LCD module 101, and would potentially be absorbed by LC 109, by absorbing some or all of the remaining radiation before it reaches the LCD module. Because absorption can occur throughout the bulk of a material, an absorption-type intermediate layer may be a relatively thicker layer, depending on the desired amount of absorption, the absorption qualities of the material, the amount of radiation to be applied, etc.

Figure 4:
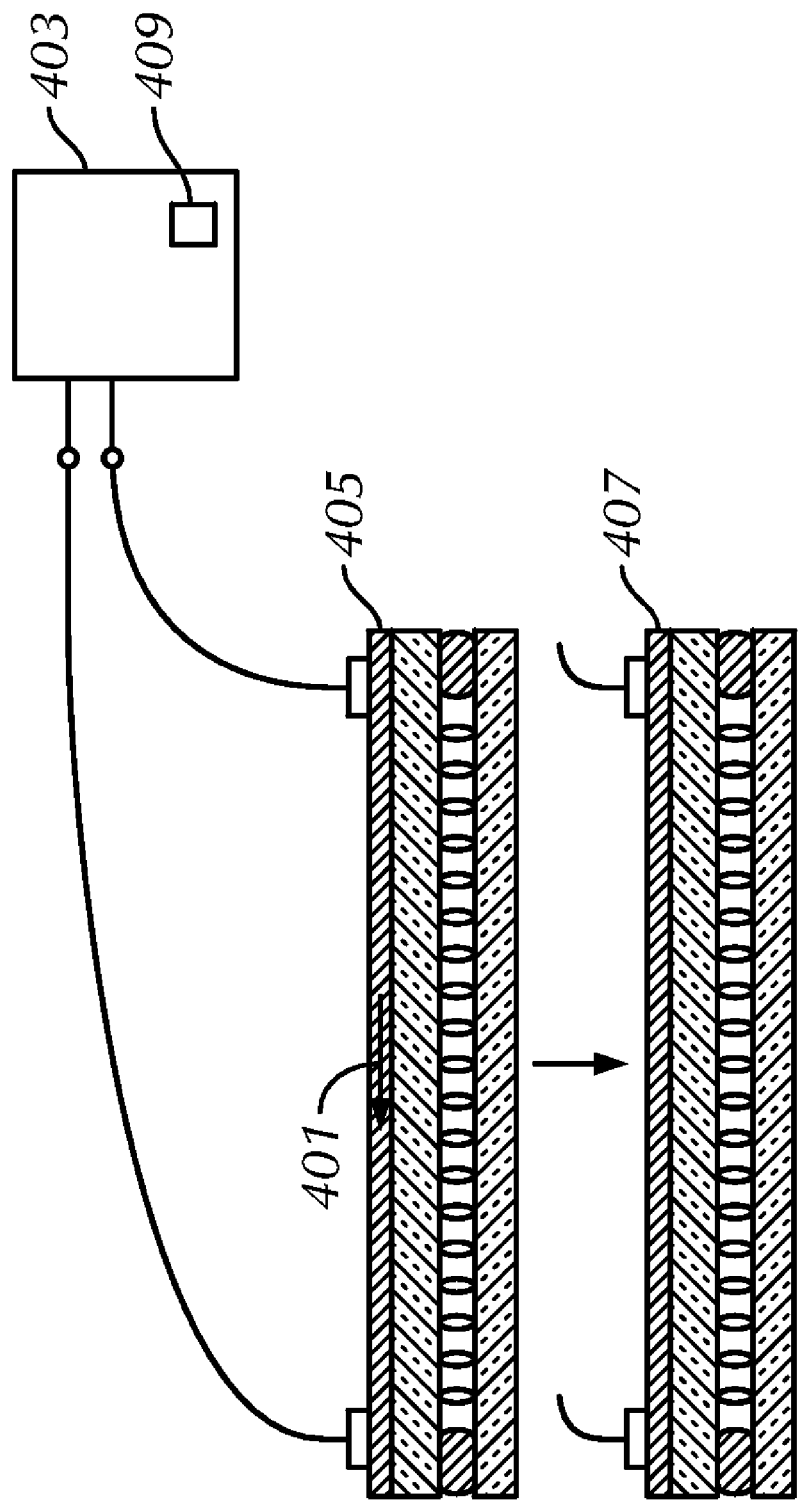
FIG. 4 illustrates another example method of forming a crystalline ITO layer according to embodiments of the invention.

FIG. 4 shows another example method of forming a crystalline ITO layer according to embodiments of the invention, in which an electrical current 401 from a current source 403 is applied to an amorphous ITO layer 405. The electrical resistance of amorphous ITO layer 405 (which can be, e.g., 400-700 Ohms per square) causes some of the energy of electrical current 401 to be absorbed by the amorphous ITO layer in the form of heat. Because CF glass 103 is an insulator, the flow of electrical current 401 is confined to ITO layer 405. Therefore, most if not all of the energy can be absorbed by amorphous ITO layer 405, thus heating the ITO to high temperature and causing phase conversion to crystalline ITO layer 407 at annealing temperature, while limiting the temperature increase of LCD module 101.

As described above, the electrical resistance of the ITO layer decreases as the phase of the ITO changes from amorphous to crystalline. In this regard, current source 403 may include a detector/controller 409 that detects the resistance of the ITO layer and reduces and/or stops current 401 when the resistance decreases to a predetermined level, such as a resistance of 100-200 Ohms per square of typical crystalline ITO. Detector/controller 409 can also control other factors, such as amount of current, timing of the application of current, etc.

Current 401 may be alternating current (AC) or direct current (DC), and may be applied in a variety of ways. For example, current 401 may be applied for a single period of time to complete the anneal process. In other embodiments, current 401 may be applied on and off multiple times over the course of the anneal process, allowing heat transferred to LCD module 101 to dissipate during off periods, which may further limit the temperature increase of the LCD module. Current 401 may be applied at a constant power level and/or frequency, or the power level and/or frequency may vary. For example, the power level may ramp up during the beginning of the anneal process and/or period of application, and may ramp down at the end of the process and/or period of application.

FIG. 5 shows another example method of forming a crystalline ITO layer according to embodiments of the invention, in which crystalline ITO may be deposited on a bare substrate, such as CF glass 103 (without a layer including amorphous ITO), using a deposition process, such as PVD, that heats ITO to high temperature (e.g., 200-350 degrees C. or higher) while limiting the temperature increase of LCD module 101. For example, LCD module 101 may be passed through a high-temperature ITO deposition chamber 501 quickly, before the temperature of LC 109 increases beyond a predetermined threshold temperature, to deposit a thin crystalline ITO layer 503. In some embodiments, for example, a single quick pass deposits approximately 50 Angstroms of crystalline ITO.

LCD module 101 can be quickly passed through chamber 501 multiple times, each pass adding an additional thin crystalline ITO layer (layers 505, 507, and 509 in FIG. 5), until the ITO layer reaches a desired thickness. For example, LCD module 101 can be quickly passed through chamber 501 four times, each pass depositing 50 Angstroms of crystalline ITO, to form a 200 Angstrom thick crystalline ITO layer. Between each pass, LCD module 101 may be allowed to cool sufficiently in order to maintain the temperature of LC 109 below the predetermined threshold temperature during the next pass. High-temperature deposition chamber 501 includes a controller 511 to control factors such as timing duration profile of each pass, temperature of deposition, etc.

FIG. 6 shows an example method of calibrating/testing a process of forming a crystalline ITO layer according to embodiments of the invention. FIG. 6 shows a tester LCD module 601 similar to LCD module 101, but including temperature indication dots 603, 605, 607, 609, and 611 positioned between LC 613 and a CF glass 615. Each temperature indication dot permanently changes color when exposed to temperatures above its particular indication temperature. The temperature indication dots may be chosen such that their indication temperatures cover a range of temperatures around the desired threshold temperature of LC 613. For example, if the desired threshold temperature of LC 613 is 100 degrees C., the indication temperatures of dots 603, 605, 607, 609, and 611 may be 90 degrees C., 95 degrees C., 100 degrees C., 105 degrees C., and 110 degrees C., respectively. A plurality of tester LCD modules like module 601 may be used to calibrate/test processes of forming crystalline ITO, such as the foregoing example processes by performing the process on a tester module, determining the approximate maximum temperature of LC 613 resulting from the process, and adjusting one or more parameters of the process based on the determined maximum temperature. The calibration/testing process may be repeated with other tester LCD modules until the maximum temperature corresponds to the desired threshold temperature of LC 613. After calibration/testing, regular LCD modules, i.e., LCD modules without temperature indication dots, may be processed to form a layer of crystalline ITO, for applications using a SITO configuration, for example, or layers of crystalline ITO, for applications using a DITO configuration, for example.

Figure 7A:
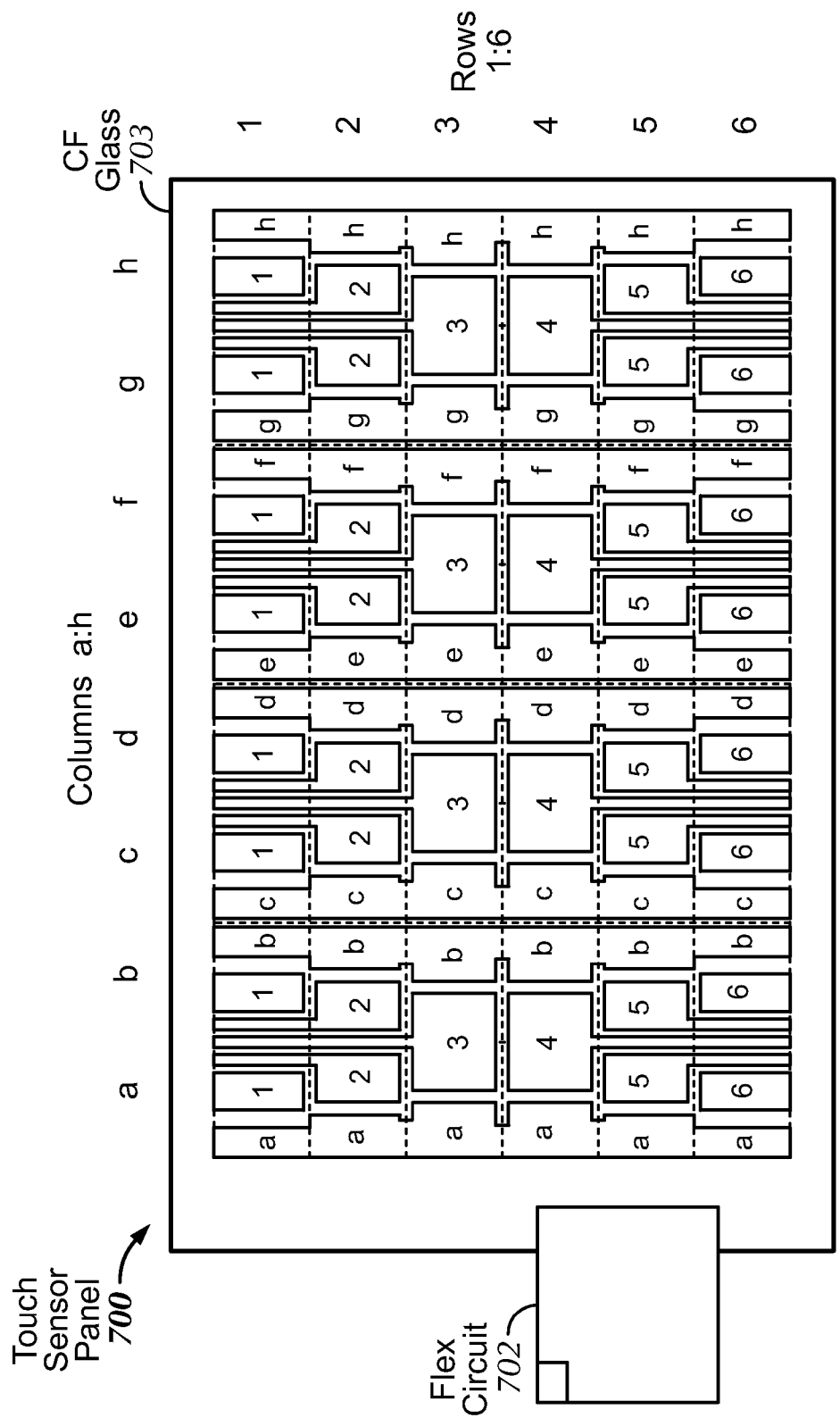

Some example SITO configurations and processes in which embodiments of the invention may be utilized will now be described with reference to FIGS. 7a-c, 8a-b, 9, 10a-c, and 11. FIG. 7a illustrates a partial view of an example touch sensor panel 700, which is has been formed by performing a glass-thinning process to thin the glass of an LCD module as described above, and then forming a single layer of crystalline ITO on top of the backside of a thinned CF glass 703 of the LCD module in accordance with embodiments of the invention. For the sake of clarity, only the backside of CF glass 703 of touch sensor panel 700 is illustrated. In the example of FIG. 7a, touch sensor panel 700 is shown having eight columns (labeled a through h) and six rows (labeled 1 through 6), although it should be understood that any number of columns and rows can be employed. Columns a through h can generally be columnar in shape, although in the example of FIG. 7a, one side of each column includes staggered edges and notches designed to create separate sections in each column. Each of rows 1 through 6 can be formed from a plurality of distinct patches or pads, each patch including a trace of the same material as the patch and routed to the border area of touch sensor panel 700 for enabling all patches in a particular row to be connected together through metal traces (not shown in FIG. 7a) running in the border areas. These metal traces can be routed to a small area on one side of touch sensor panel 700 and connected to a flex circuit 702. As shown in the example of FIG. 7a, the patches forming the rows can be arranged in a generally pyramid-shaped configuration. In FIG. 7a, for example, the patches for rows 1-3 between columns a and b are arranged in an inverted pyramid configuration, while the patches for rows 4-6 between columns a and b are arranged in an upright pyramid configuration.

The columns and patches of FIG. 7a can be formed in a co-planar single layer of crystalline ITO, which is suitable for touch screen applications. The SITO layer can be formed either on the back of a coverglass, such as CF glass 703, or on the top of a separate substrate.

Figure 7B:
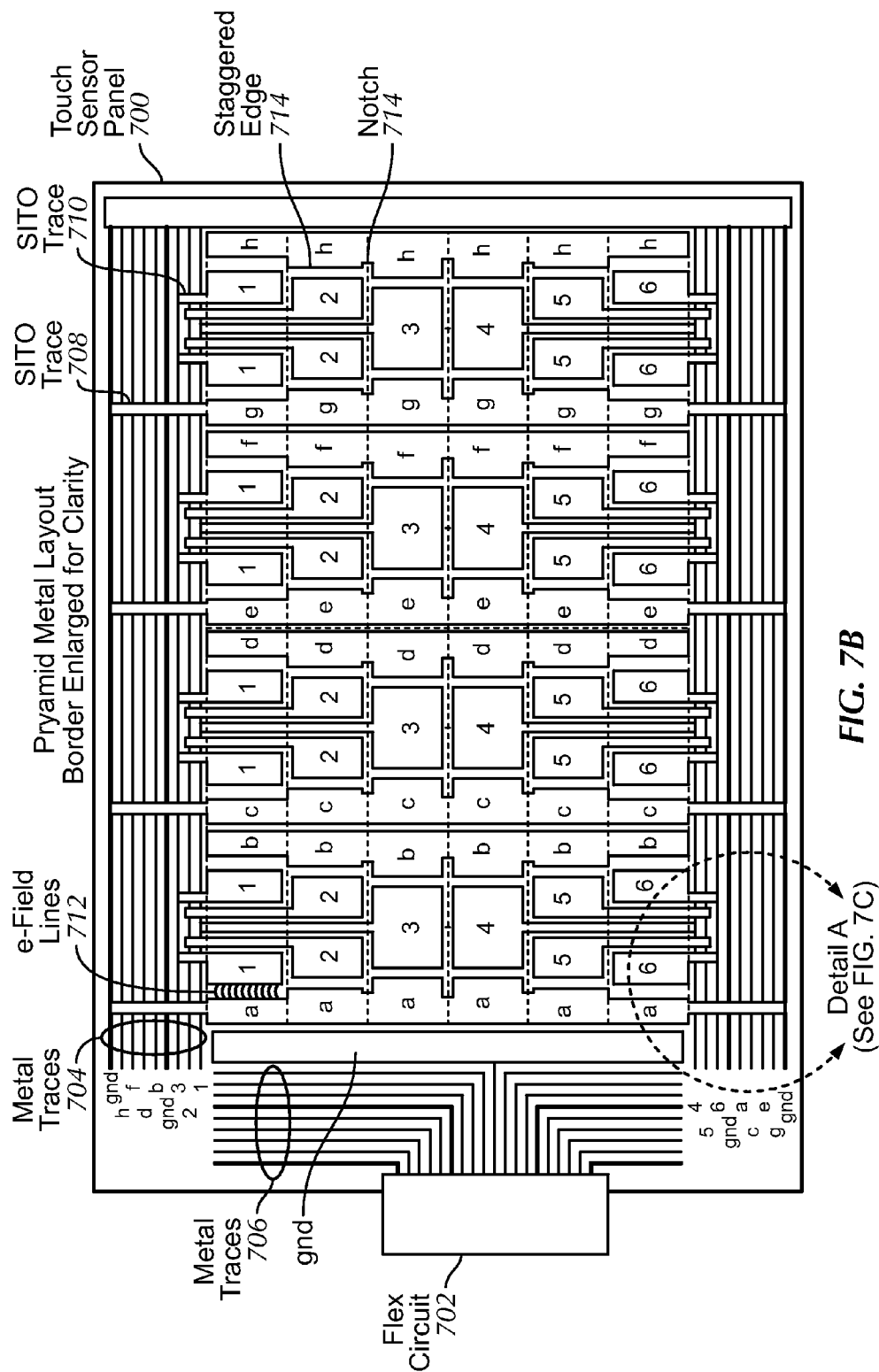

FIG. 7b illustrates a partial view of example touch sensor panel 700 including metal traces 704 and 706 running in the border areas of the touch sensor panel according to embodiments of the invention. Note that the border areas in FIG. 7b are enlarged for clarity. Each column a-h can include SITO trace 708 that allows the column to be connected to a metal trace through a via (not shown in FIG. 7b). One side of each column includes staggered edges 714 and notches 716 designed to create separate sections in each column. Each row patch 1-6 can include SITO trace 710 that allows the patch to be connected to a metal trace through a via (not shown in FIG. 7b). SITO traces 710 can allow each patch in a particular row to be self-connected to each other. Because all metal traces 704 and 706 are formed on the same layer, they can all be routed to the same flex circuit 702.

If touch sensor panel 700 is operated as a mutual capacitance touch sensor panel, either the columns a-h or the rows 1-6 can be driven with one or more stimulation signals, and fringing electric field lines can form between adjacent column areas and row patches. In FIG. 7b, it should be understood that although only electric field lines 712 between column a and row patch 1 (a-1) are shown for purposes of illustration, electric field lines can be formed between other adjacent column and row patches (e.g. a-2, b-4, g-5, etc.) depending on what columns or rows are being stimulated. Thus, it should be understood that each column-row patch pair (e.g. a-1, a-2, b-4, g-5, etc.) can represent a two-electrode pixel or sensor at which charge can be coupled onto the sense electrode from the drive electrode. When a finger touches down over one of these pixels, some of the fringing electric field lines that extend beyond the cover of the touch sensor panel are blocked by the finger, reducing the amount of charge coupled onto the sense electrode. This reduction in the amount of coupled charge can be detected as part of determining a resultant "image" of touch. It should be noted that in mutual capacitance touch sensor panel designs as shown in FIG. 7b, no separate reference ground is needed, so no second layer on the back side of the substrate, or on a separate substrate, is needed.

Touch sensor panel 700 can also be operated as a self-capacitance touch sensor panel. In such an embodiment, a reference ground plane can be formed on the back side of the substrate, on the same side as the patches and columns but separated from the patches and columns by a dielectric, or on a separate substrate. In a self-capacitance touch sensor panel, each pixel or sensor has a self-capacitance to the reference ground that can be changed due to the presence of a finger. In self-capacitance embodiments, the self-capacitance of columns a-h can be sensed independently, and the self-capacitance of rows 1-6 can also be sensed independently.

FIG. 7c illustrates an example connection of columns and row patches to the metal traces in the border area of the touch sensor panel according to embodiments of the invention. FIG. 7c represents "Detail A" as shown in FIG. 7b, and shows column "a" and row patches 4-6 connected to metal traces 718 through SITO traces 708 and 710. Because SITO traces 708 and 710 are separated from metal traces 718 by a dielectric material, vias 720 formed in the dielectric material allow the SITO traces to connect to the metal traces.

FIG. 8a illustrates an example cross-section of touch sensor panel 800 showing SITO trace 808 and metal traces 818 connected though via 820 in dielectric material 822 according to embodiments of the invention. FIG. 8a represents view B-B as shown in FIG. 7c.

Figure 8B:
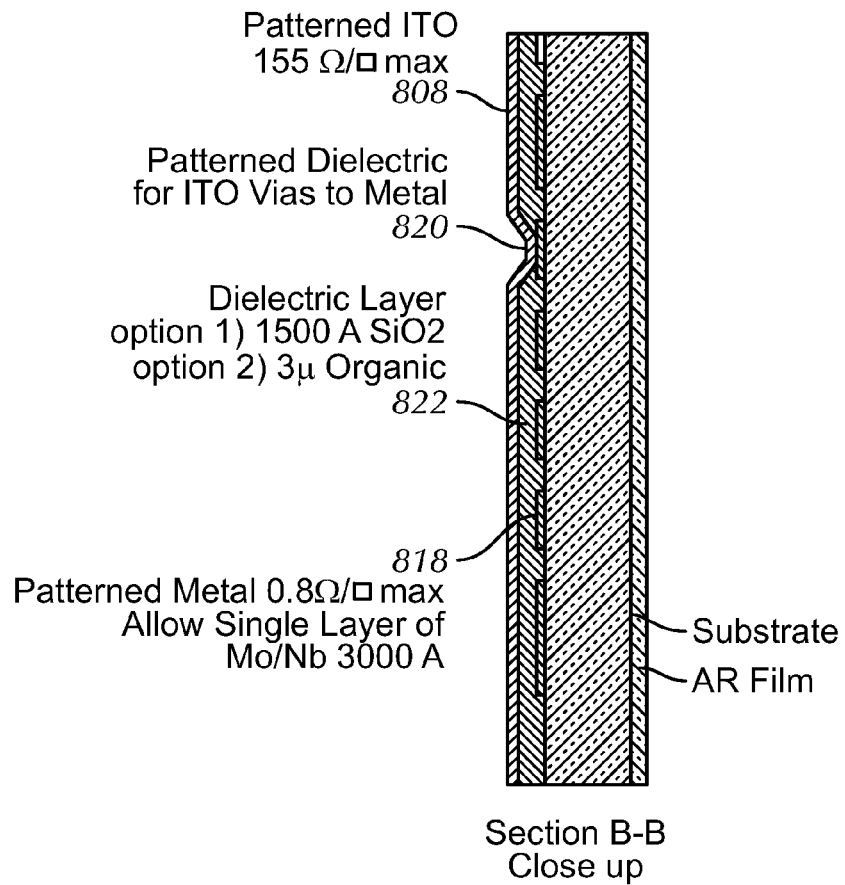

FIG. 8b is a close-up view of the example cross-section shown in FIG. 8a according to embodiments of the invention. FIG. 8b shows one example embodiment wherein SITO trace 808 has a resistivity of about 155 ohms per square max. In one embodiment, dielectric 822 can be about 1500 angstroms of inorganic $SiO_2$, which can be processed at a higher temperature and therefore allows the SITO layer to be sputtered with higher quality. In another embodiment, dielectric 822 can be about 3.0 microns of organic polymer. The 1500 angstroms of inorganic $SiO_2$ can be used for touch sensor panels small enough such that the crossover capacitance (between SITO trace 808 and metal traces 818) should not be an issue.

For larger touch sensor panels (having a diagonal dimension of about 3.5" or greater), crossover capacitance can be an issue, creating an error signal that can only partially be compensated. Thus, for larger touch sensor panels, a thicker dielectric layer 822 with a lower dielectric constant such as about 3.0 microns of organic polymer can be used to lower the crossover capacitance.

Referring again to the example of FIG. 7c, column edges 714 and row patches 4-6 can be staggered in the x-dimension because space must be made for SITO traces 710 connecting row patches 4 and 5. (It should be understood that row patch 4 in the example of FIG. 7c is really two patches stuck together.) To gain optimal touch sensitivity, it can be desirable to balance the area of the electrodes in pixels a-6, a-5 and a-4. However, if column "a" was kept linear, row patch 6 can be slimmer than row patch 5 or 6, and an imbalance would be created between the electrodes of pixel a-6.

Figure 9:
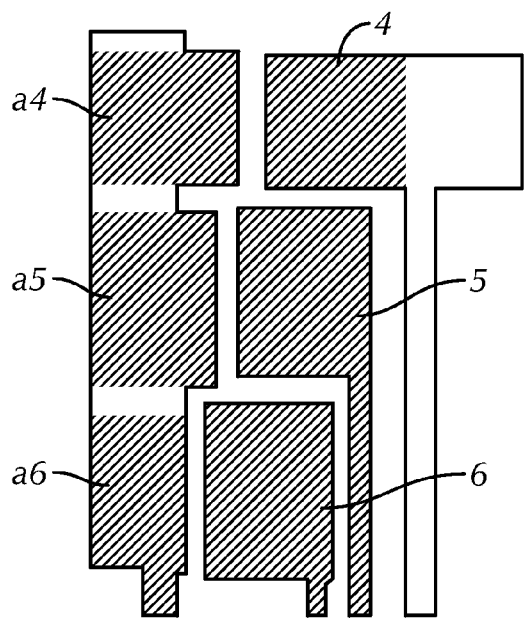
FIG. 9 illustrates further details of the example SITO configuration of FIGS. 7a-c and 8a-b.

FIG. 9 illustrates a top view of an example column and adjacent row patches according to embodiments of the invention. It can be generally desirable to make the mutual capacitance characteristics of pixels a-4, a-5 and a-6 relatively constant to produce a relatively uniform z-direction touch sensitivity that stays within the range of touch sensing circuitry. Accordingly, the column areas $a_4$, $a_5$ and $a_6$ should be about the same as row patch areas 4, 5 and 6. To accomplish this, column section $a_4$ and $a_5$, and row patch 4 and 5 can be shrunk in the y-direction as compared to column section a6 and row patch 6 so that the area of column segment $a_4$ matches the area of column segments $a_5$ and $a_6$. In other words, pixel $a_4$-4 will be wider but shorter than pixel $a_6$-6, which will be narrower but taller.

It should be evident from the previously mentioned figures that raw spatial sensitivity can be somewhat distorted. In other words, because the pixels or sensors can be slightly skewed or misaligned in the x-direction, the x-coordinate of a maximized touch event on pixel a-6 (e.g. a finger placed down directly over pixel a-6) can be slightly different from the x-coordinate of a maximized touch event on pixel a-4, for example. Accordingly, in embodiments of the invention this misalignment can be de-warped in a software algorithm to re-map the pixels and remove the distortion.

Although a typical touch panel grid dimension can have pixels arranged on 5.0 mm centers, a more spread-out grid having about 6.0 mm centers, for example, can be desirable to reduce the overall number of electrical connections in the touch sensor panel. However, spreading out the sensor pattern can cause erroneous touch readings.

Figure 10A:
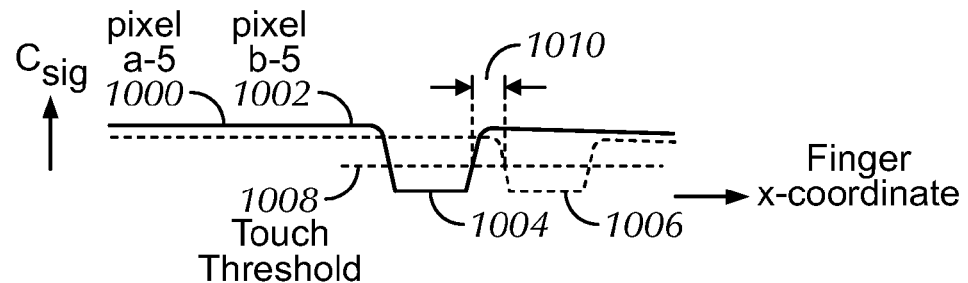
FIGS. 10a-b illustrate example capacitance measurements of a touch sensor panel having a SITO configuration formed according to embodiments of the invention.

FIG. 10a is a plot of an x-coordinate of a finger touch versus mutual capacitance seen at a pixel for a two adjacent pixels a-5 and b-5 in a single row having wide spacings. In FIG. 10a, plot 1000 represents the mutual capacitance seen at pixel a-5 as the finger touch moves continuously from left to right, and plot 1002 represents the mutual capacitance seen at pixel b-5 as the finger touch moves continuously from left to right. As expected, a drop in the mutual capacitance 1004 is seen at pixel a-5 when the finger touch passes directly over pixel a-5, and a similar drop in the mutual capacitance 1006 is seen at pixel b-5 when the finger touch passes directly over pixel b-5. If line 1008 represents a threshold for detecting a touch event, FIG. 10a illustrates that even though the finger is never lifted from the surface of the touch sensor panel, it can erroneously appear at 1010 that the finger has momentarily lifted off the surface. This location 1010 can represent a point about halfway between the two spread-out pixels.

Figure 10B:
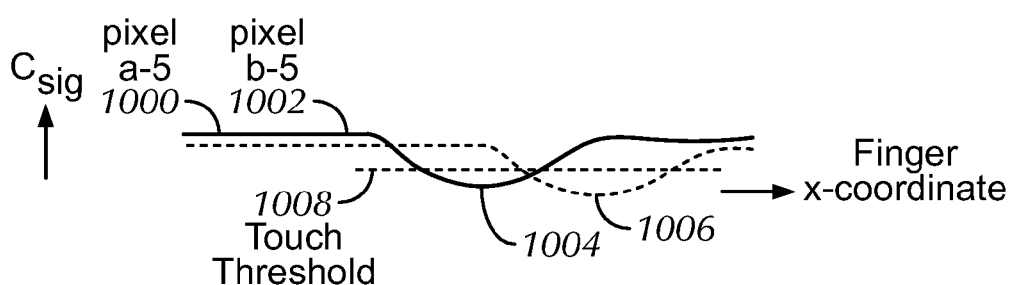

FIG. 10b is a plot of an x-coordinate of a finger touch versus mutual capacitance seen at a pixel for a two adjacent pixels a-5 and b-5 in a single row having wide spacings where spatial interpolation has been provided according to embodiments of the invention. As expected, a drop in the mutual capacitance 1004 is seen at pixel a-5 when the finger touch passes directly over pixel a-5, and a similar drop in the mutual capacitance 1006 is seen at pixel b-5 when the finger touch passes directly over pixel b-5. Note, however, that the rise and fall in the mutual capacitance value occurs more gradually than in FIG. 10a. If line 1008 represents a threshold for detecting a touch event, FIG. 10b illustrates that as the finger moves from left to right over pixel a-5 and b-5, a touch event is always detected at either pixel a-5 or b-5. In other words, this "blurring" of touch events is helpful to prevent the appearance of false no-touch readings.

In one embodiment of the invention, the coverglass, such as CF glass 703 is not thinned, rather, the thickness of the coverglass for the touch sensor panel can be increased to create part or all of the spatial blurring or filtering shown in FIG. 10b.

Figure 10C:
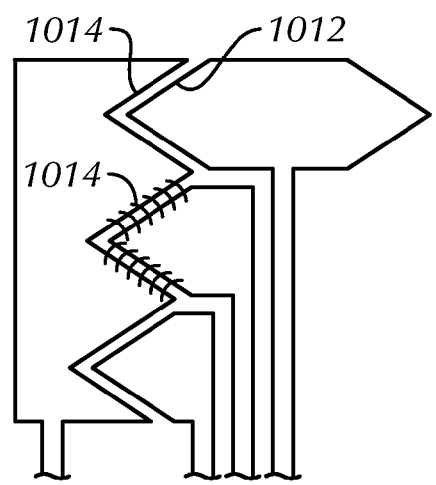
FIG. 10c illustrates another example SITO configuration.

FIG. 10c illustrates a top view of an example column and adjacent row patch pattern useful for larger pixel spacings according to embodiments of the invention. FIG. 10c illustrates an example embodiment in which sawtooth electrode edges 1012 are employed within a pixel elongated in the x-direction. The sawtooth electrode edges can allow fringing electric field lines 1014 to be present over a larger area in the x-direction so that a touch event can be detected by the same pixel over a larger distance in the x-direction. It should be understood that the sawtooth configuration of FIG. 10c is only example, and that other configurations such serpentine edges and the like can also be used. These configurations can further soften the touch patterns and create additional spatial filtering and interpolation between adjacent pixels as shown in FIG. 10b.

Figure 11:
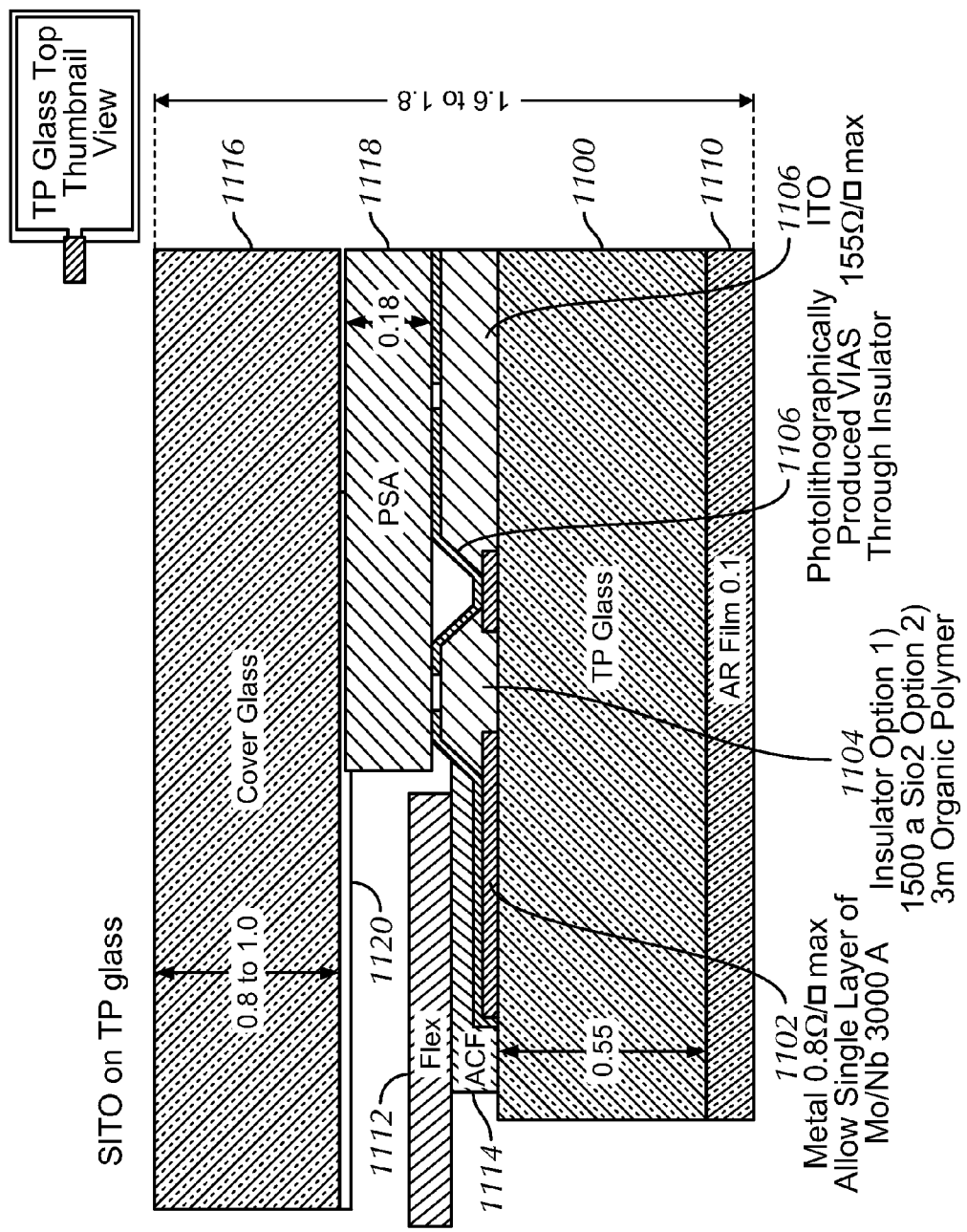
FIG. 11 illustrates an example SITO stackup that includes SITO formed according to embodiments of the invention.

FIG. 11 illustrates an example stackup of SITO on a touch sensor panel substrate bonded to a cover glass according to embodiments of the invention. The stackup can include touch sensor panel substrate 1100, which can be formed from glass, upon which anti-reflective (AR) film 1110 can be formed on one side and metal 1102 can be deposited and patterned on the other side to form the bus lines in the border areas. Metal 1102 can have a resistivity of 0.8 ohms per square maximum. Insulating layer 1104 can then be deposited over substrate 1100 and metal 1102. Insulating layer can be, for example, $SiO_2$ with a thickness of 1500 angstroms, or 3 microns of organic polymer. Photolithography can be used to form vias 1106 in insulator 1104, and crystalline ITO 1108 can then deposited according to embodiments of the invention and patterned on top of the insulator and metal 1102. The single layer of crystalline ITO 1108, which has a resistivity of 155 ohms per square maximum, can be more transparent than multi-layer designs, and can be easier to manufacture. Flex circuit 1112 can be bonded to conductive material 1108 and metal 1102 using adhesive 1114 such as anisotropic conductive film (ACF). The entire subassembly can then be bonded to cover glass 1116 and blackmask 1120 using adhesive 1118 such as pressure sensitive adhesive (PSA).

In an alternative embodiment, the metal, insulator, conductive material as described above can be formed directly on the back side of the cover glass.

Figure 12:
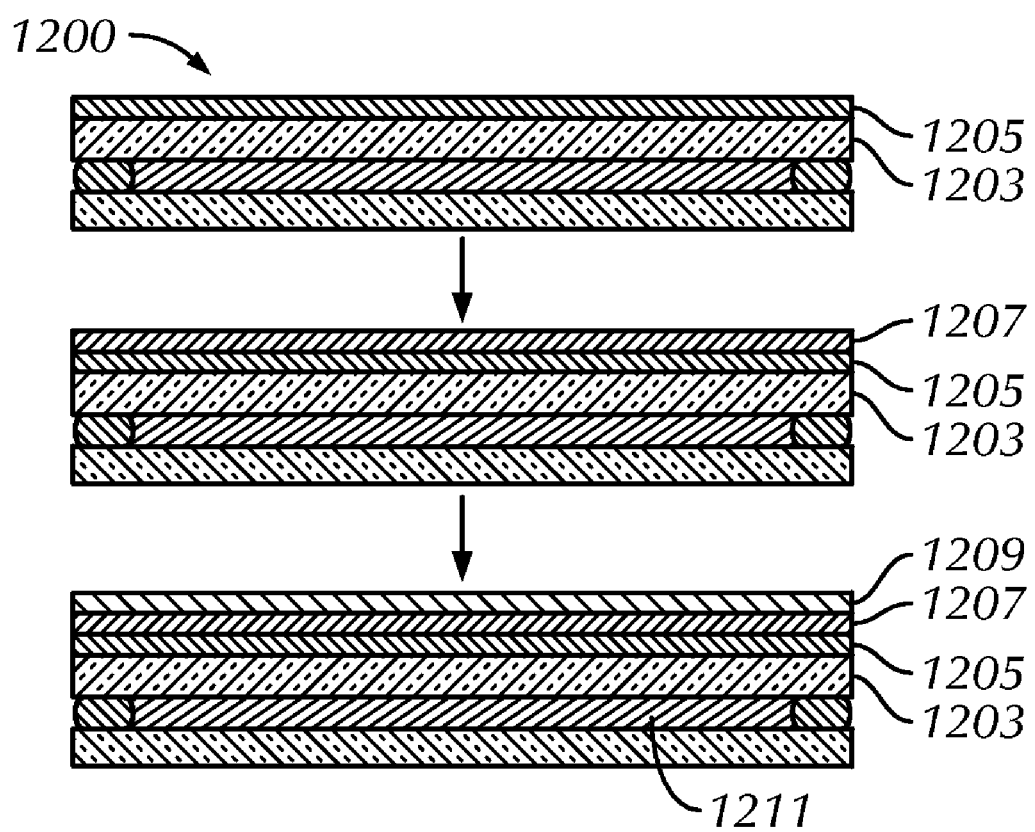
FIG. 12 illustrates an example DITO configuration and process that includes forming DITO layers according to embodiments of the invention.

An example DITO configuration and process in which embodiments of the invention may be utilized will now be described with reference to FIG. 12. FIG. 12 illustrates a partial view of an example LCD module 1200, which is has undergone a glass-thinning process to thin a CF glass 1203 as described above. A single layer of crystalline ITO 1205 is formed on top of the backside of thinned CF glass 1203 in accordance with embodiments of the invention to form, for example, drive lines of the DITO configuration. An insulating layer 1207 is formed on top of ITO layer 1205, and a second crystalline ITO layer 1209 is formed on top of layer 1207 in accordance with embodiments of the invention to form, for example, sense lines of the DITO configuration. Because insulating layer 1207 may provide some additional protection from temperature increases in an LC 1211 during the formation of second ITO layer 1209, the process for forming second ITO layer 1209 may not be the same process used to form first ITO layer 1205, but may be adjusted to take exploit the additional protection. For example, if a fast deposition process is used, LCD module may be kept in the deposition chamber for a longer period of time when forming the second ITO layer (in comparison to the process for forming the first ITO layer), and thus may require fewer passes through the chamber.

Figure 13:
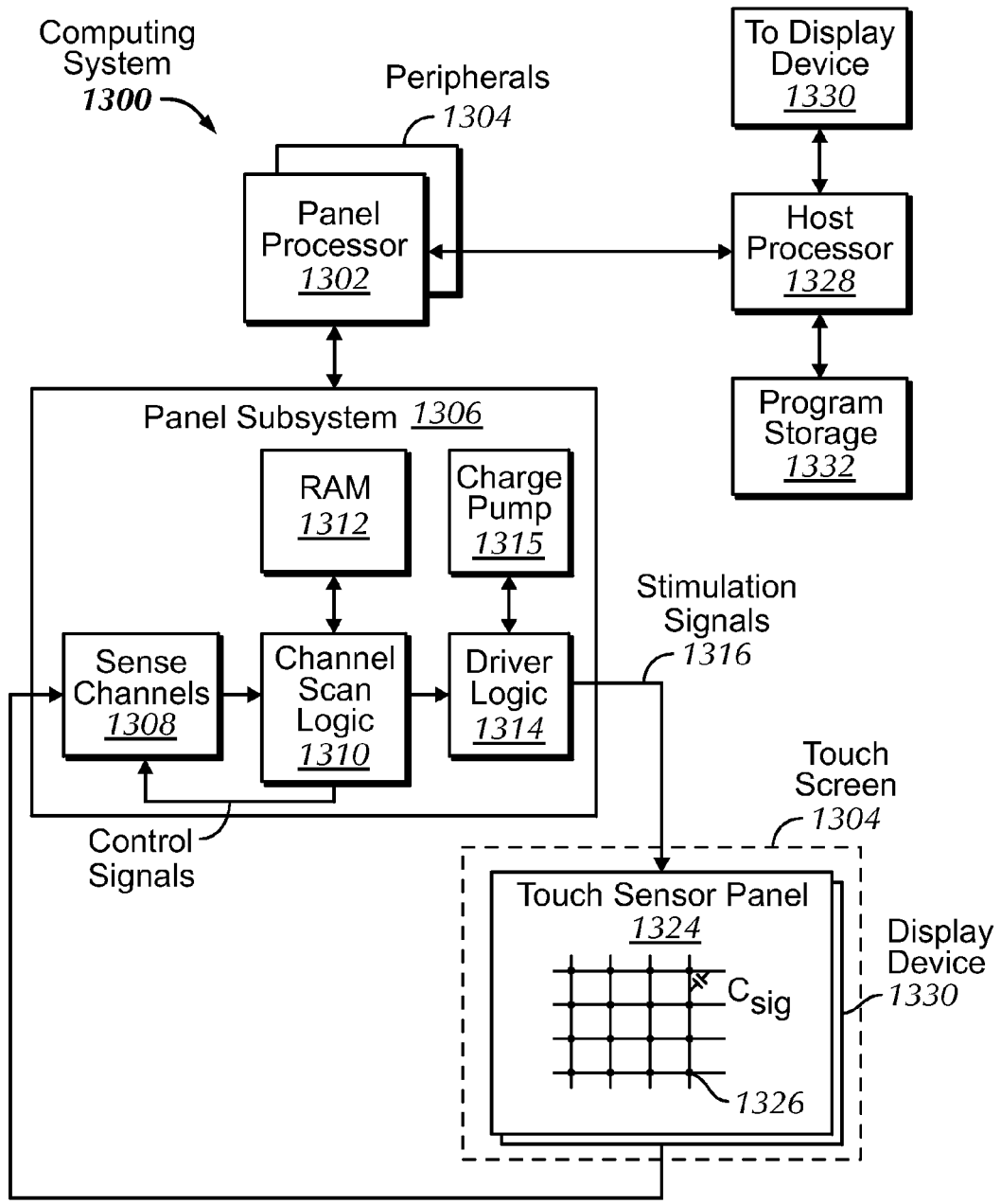
FIG. 13 illustrates an example computing system including a touch sensor panel utilizing a crystalline ITO layer or layers formed according to embodiments of the invention.

FIG. 13 illustrates example computing system 1300 that can include one or more of the embodiments of the invention described above. Computing system 1300 can include one or more panel processors 1302 and peripherals 1304, and panel subsystem 1306. Peripherals 1304 can include, but are not limited to, random access memory (RAM) or other types of memory or storage, watchdog timers and the like. Panel subsystem 1306 can include, but is not limited to, one or more sense channels 1308, channel scan logic 1310 and driver logic 1314. Channel scan logic 1310 can access RAM 1312, autonomously read data from the sense channels and provide control for the sense channels. In addition, channel scan logic 1310 can control driver logic 1314 to generate stimulation signals 1316 at various frequencies and phases that can be selectively applied to drive lines of touch sensor panel 1324. In some embodiments, panel subsystem 1306, panel processor 1302 and peripherals 1304 can be integrated into a single application specific integrated circuit (ASIC).

Touch sensor panel 1324 can include a capacitive sensing medium having a plurality of drive lines and a plurality of sense lines, although other sensing media can also be used. Either or both of the drive and sense lines can be coupled to conductive traces. Each intersection of drive and sense lines can represent a capacitive sensing node and can be viewed as picture element (pixel) 1326, which can be particularly useful when touch sensor panel 1324 is viewed as capturing an "image" of touch. (In other words, after panel subsystem 1306 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 1324 can drive sense channel 1308 (also referred to herein as an event detection and demodulation circuit) in panel subsystem 1306.

Computing system 1300 can also include host processor 1328 for receiving outputs from panel processor 1302 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 1328 can also perform additional functions that may not be related to panel processing, and can be coupled to program storage 1332 and display device 1330 such as an LCD display for providing a UI to a user of the device. Display device 1330 together with touch sensor panel 1324, when located partially or entirely under the touch sensor panel, can form touch screen 1318.

Note that one or more of the functions described above can be performed by firmware stored in memory (e.g. one of the peripherals 1304 in FIG. 13) and executed by panel processor 1302, or stored in program storage 1332 and executed by host processor 1328. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 14A:
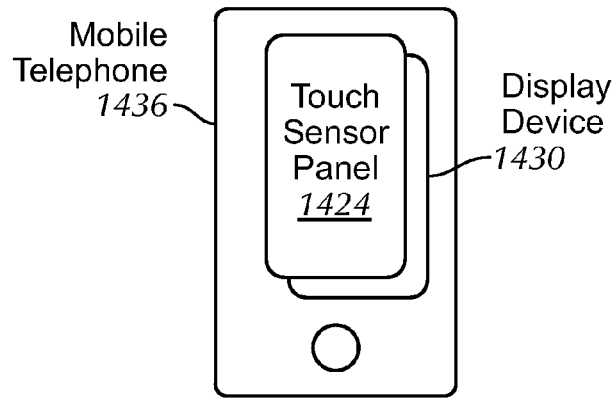
FIG. 14a illustrates an example mobile telephone having a touch sensor panel including a crystalline ITO layer or layers formed according to embodiments of the invention.

FIG. 14a illustrates example mobile telephone 1436 that can include touch sensor panel 1424 and display device 1430, the touch sensor panel including a crystalline ITO layer or layers formed according to embodiments of the invention.

Figure 14B:
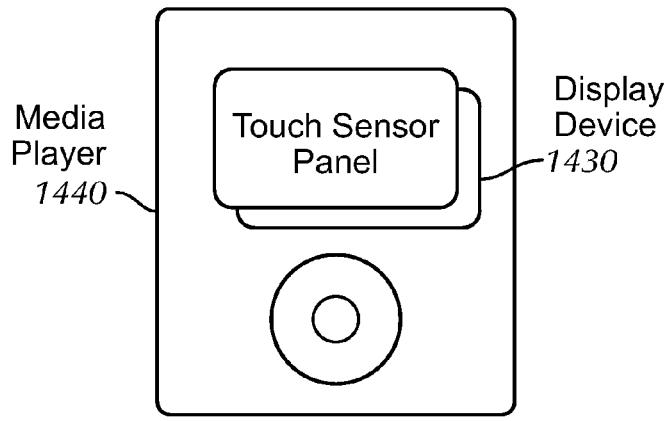
FIG. 14b illustrates an example digital media player having a touch sensor panel including a crystalline ITO layer or layers formed according to embodiments of the invention.

FIG. 14b illustrates example digital media player 1440 that can include touch sensor panel 1424 and display device 1430, the touch sensor panel including a crystalline ITO layer or layers formed according to embodiments of the invention.

Figure 14C:
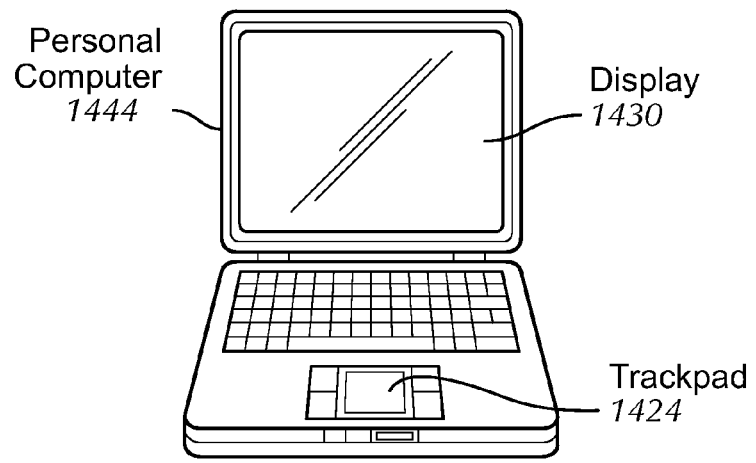
FIG. 14c illustrates an example personal computer having a touch sensor panel (trackpad) and/or display including a crystalline ITO layer or layers formed according to embodiments of the invention.

FIG. 14c illustrates example personal computer 1444 that can include touch sensor panel (trackpad) 1424 and display 1430, the touch sensor panel and/or display of the personal computer (in embodiments where the display is part of a touch screen) including a crystalline ITO layer or layers formed according to embodiments of the invention. The thickness and weight of mobile telephone, media player and personal computer of FIGS. 14a, 14b and 14c may be improved by utilizing a crystalline ITO layer or layers formed according to embodiments of the invention.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method of forming a crystalline indium tin oxide (ITO) layer on top of a nonconductive substrate, the method comprising:
   forming a layer including amorphous ITO on top of the substrate;
   heating the layer including amorphous ITO to a first temperature, the first temperature being sufficient to form crystalline ITO from at least a portion of the amorphous ITO, by applying electrical current to the layer including amorphous ITO, such that a temperature of the substrate remains less than the first temperature during the formation of the crystalline ITO.

2. The method of claim 1, further comprising:
   measuring the electrical resistance of the layer including amorphous ITO during the application of the electrical current; and
   modifying the application of the electrical current based on the measured electrical resistance.

3. The method of claim 1, wherein applying the electrical current includes applying a first electrical current during a first period of time, stopping the application of the first electrical current during a second period of time, after the first period of time, and applying a second electrical current during a third period of time, after the second period of time.

4. A method of forming a crystalline indium tin oxide (ITO) layer on top of a substrate, the method comprising:
   heating ITO to a first temperature during a deposition of the ITO onto the substrate, the first temperature being sufficient to form crystalline ITO on the substrate;
   applying the deposition to the substrate for a first period of time during which a portion of the crystalline ITO layer is deposited on the substrate, such that a temperature of the substrate remains less than the first temperature during the first period;
   removing the substrate from the deposition for a second period of time, after the first period of time, during which the temperature of the substrate decreases; and
   repeating the applying and the removing until the crystalline ITO layer is formed.

5. The method of claim 4, wherein the deposition is a physical vapor deposition.

6. A method of annealing a layer of material that is deposited on a substrate, the method comprising:
   exposing the layer of material to electromagnetic (EM) radiation that has a wavelength that is absorbed by the material and that heats the material to an annealing temperature;
   limiting a temperature increase of the substrate to less than a predetermined temperature by limiting the EM radiation exposure to a time duration profile of exposure and by setting a wavelength of the EM radiation, an intensity of the EM radiation, and an incident angle of the EM radiation.

7. A method of depositing a layer of material on top of a substrate at a high temperature, the method comprising:
   passing the substrate through a high-temperature deposition chamber a plurality of times, wherein a portion of the layer of material is deposited during each pass; and
   limiting a temperature increase of the substrate to less than a predetermined temperature by limiting durations of the passes and by allowing a temperature of the substrate to decrease during time periods between passes.

8. An apparatus for forming a crystalline indium tin oxide (ITO) layer on top of a nonconductive substrate, the apparatus comprising:
   a current source controller that applies electrical current to a layer including amorphous ITO on top of the nonconductive substrate, wherein the layer including amorphous ITO is heated to a first temperature, the first temperature being sufficient to form crystalline ITO from at least a portion of the amorphous ITO, and a temperature of the substrate remains less than the first temperature during the formation of the crystalline ITO.

9. The apparatus of claim 8, further comprising:
   a detector that measures the electrical resistance of the layer including amorphous ITO during the application of the electrical current, wherein the controller modifies the application of the electrical current based on the measured electrical resistance.

10. The apparatus of claim 8, wherein the controller controls the current source to apply a first electrical current during a first period of time, to stop the application of the first electrical current during a second period of time, after the first period of time, and to apply a second electrical current during a third period of time, after the second period of time.

11. An apparatus for forming a crystalline indium tin oxide (ITO) layer on top of a substrate, the apparatus comprising:
   a deposition chamber system that heats ITO to a first temperature in a deposition chamber, and deposits the ITO onto the substrate, the first temperature being sufficient to form crystalline ITO on the substrate; and
   a controller that controls the deposition chamber system to place the substrate in the deposition chamber for a first period of time during which a portion of the crystalline ITO layer is deposited on the substrate, such that a temperature of the substrate remains less than the first temperature during the first period, to remove the substrate from the deposition chamber for a second period of time, after the first period of time, during which the temperature of the substrate decreases, and to repeat the placing and the removing until the crystalline ITO layer is formed.

12. The apparatus of claim 11, wherein the deposition chamber is a physical vapor deposition chamber.

13. An apparatus for annealing a layer of material that is deposited on a substrate, the apparatus comprising:
   an electromagnetic (EM) radiation source that exposes the layer of material to EM radiation that has a wavelength that is absorbed by the material and that heats the material to an annealing temperature;
   a controller that limits a temperature increase of the substrate to less than a predetermined temperature by limiting the EM radiation exposure to a time duration profile of exposure and by setting a wavelength of the EM radiation, an intensity of the EM radiation, and an incident angle of the EM radiation.

14. An apparatus for depositing a layer of material on top of a substrate at a high temperature, the apparatus comprising:
   a high-temperature deposition system that passes the substrate through a high-temperature deposition chamber a plurality of times, wherein a portion of the layer of material is deposited during each pass; and
   a controller that limits a temperature increase of the substrate to less than a predetermined temperature by limiting durations of the passes and by allowing a temperature of the substrate to decrease during time periods between passes.

15. The method of claim 1, wherein applying the electrical current includes varying one of a power level of the electrical current and a frequency of the electrical current during the application of the electrical current.

16. The method of claim 15, wherein applying the electrical current includes one of ramping up the power level at a beginning of the application of the electrical current and ramping down the power level at an end of the application of the electrical current.

17. The method of claim 2, wherein modifying the application of the electrical current includes modifying one of an amount of the electrical current and a timing of the application of the electrical current.

18. The method of claim 17, wherein modifying the timing of the application of the electrical current includes stopping the application of the electrical current when the measured electrical resistance reaches a predetermined threshold.

19. The method of claim 6, wherein the incident angle of the EM radiation is within a range between and including a grazing angle and a 45 degree angle.

20. The apparatus of claim 8, wherein the controller varies one of a power level of the electrical current and frequency of the electrical current during the application of the electrical current.

21. The apparatus of claim 20, wherein application of the the electrical current by the controller includes one of ramping up the power level at a beginning of the application of the electrical current and ramping down the power level at an end of the application of the electrical current.

22. The apparatus of claim 9, wherein the modifying of the application of the electrical current by the controller includes modifying one of an amount of the electrical current and a timing of the application of the electrical current.

23. The apparatus of claim 22, wherein the modifying of the timing of the application of the electrical current by the controller includes stopping the application of the electrical current when the measured electrical resistance reaches a predetermined threshold.

24. The apparatus of claim 13, wherein the incident angle of the EM radiation is within a range between and including a grazing angle and a 45 degree angle.

* * * * *